(12) United States Patent
Hsieh et al.

(10) Patent No.: US 11,360,604 B2
(45) Date of Patent: Jun. 14, 2022

(54) DISPLAY DEVICE AND ADJUSTING MECHANISM THEREOF

(71) Applicant: Qisda Corporation, Taoyuan (TW)

(72) Inventors: Yung-Tsun Hsieh, Taipei (TW); Yi-An Ma, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/987,518

(22) Filed: Aug. 7, 2020

(65) Prior Publication Data

US 2021/0048917 A1 Feb. 18, 2021

(30) Foreign Application Priority Data

Aug. 13, 2019 (CN) .......................... 201910742305.2

(51) Int. Cl.
*G06F 3/041* (2006.01)
*G06F 3/042* (2006.01)
*H05K 5/00* (2006.01)
*H05K 5/02* (2006.01)

(52) U.S. Cl.
CPC .......... *G06F 3/0418* (2013.01); *G06F 3/0421* (2013.01); *G06F 3/0428* (2013.01); *H05K 5/0017* (2013.01); *H05K 5/0217* (2013.01)

(58) Field of Classification Search
CPC .... G06F 1/1601; G06F 3/0418; G06F 3/0421; G06F 3/0428; H05K 5/0017; H05K 5/0217
See application file for complete search history.

(56) References Cited

U.S. PATENT DOCUMENTS

| | | | |
|---|---|---|---|
| 9,140,540 B2 * | 9/2015 | Kuba | G06F 3/0428 |
| 2014/0160494 A1 * | 6/2014 | Kuba | G06F 3/0421 356/614 |
| 2019/0129234 A1 * | 5/2019 | Eom | G06F 1/1601 |

* cited by examiner

*Primary Examiner* — Afroza Chowdhury

(57) ABSTRACT

A display device is provided. The display device includes a front frame, a rear cover, a display panel, a plurality of sensors and at least one adjusting mechanism. The front frame has an opening. The front frame and the rear cover are fixed to form an accommodation space. The display panel, disposed in the accommodating space, has a display surface exposed to the opening. A plurality of sensors are disposed on the front frame and configured to receive and emit an optical signal above the display surface. At least one adjusting mechanism is disposed on the rear cover and configured to adjust a deformation amount of the front frame to maintain the sensors at a predetermined emitting position and a receiving position.

15 Claims, 4 Drawing Sheets

DISPLAY DEVICE AND ADJUSTING MECHANISM THEREOF

This application claims the benefit of People's Republic of China application Serial No. 201910742305.2, filed Aug. 13, 2019, the subject matter of which is incorporated herein by reference.

BACKGROUND OF THE INVENTION

Field of the Invention

The invention relates in general to a display device, and more particularly to a display device and an adjusting mechanism thereof.

Description of the Related Art

Along with the advance in the development of the electronic technology, display device has been widely used in various fields such as education, business and household. To save the cost of the touch display panel, the large-sized display device with touch function normally detects the touch position of the finger by emitting and receiving the infrared signal using the infrared touch device disposed on the front frame of the display device.

However, ordinary infrared touch device is disposed in the front frame of the display device. If the length and the width of the display device are over a certain size and the strength of the front frame is insufficient, the front frame may be easily deformed during the handling process. If the front frame is deformed, the infrared signal may not be received or may touch other structure and result in a false touch. If the structure of the front frame is reinforced to avoid the front frame being deformed, the display device may become too heavy. To assure the quality of the infrared touch device, the industries has a high requirement regarding the flatness of the front frame of the display device.

SUMMARY OF THE INVENTION

The invention is directed to a display device and an adjusting mechanism thereof configured to adjust a deformation amount of the front frame to maintain the sensors at a predetermined emitting position and a receiving position.

According to one embodiment of the present invention, a display device is provided. The display device includes a front frame, a rear cover, a display panel, a plurality of sensors and at least one adjusting mechanism. The front frame has an opening. The front frame and the rear cover are fixed to form an accommodation space. The display panel, disposed in the accommodating space, has a display surface exposed to the opening. A plurality of sensors are disposed on the front frame and configured to receive and emit an optical signal above the display surface. At least one adjusting mechanism is disposed on the rear cover and configured to adjust a deformation amount of the front frame to maintain the sensors at a predetermined emitting position and a receiving position.

According to another embodiment of the present invention, an adjusting mechanism adapted to a display panel is provided. The display panel has a display surface exposed to an opening of a front frame. A plurality of sensors are disposed on the front frame and located above the display surface. The adjusting mechanism is configured to adjust a deformation amount of the front frame to maintain the sensors at a predetermined emitting position and a receiving position.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention. Similar/identical designations are used to indicate similar/identical elements. Directional terms such as above, under, left, right, front or back are used in the following embodiments to indicate the directions of the accompanying drawings, not for limiting the present invention.

According to an embodiment of the present invention, a display device with an adjusting mechanism is provided. The display device adjusts a deformation amount of the front frame and adjusts the flatness of the front frame to maintain the sensors at a predetermined emitting position and a receiving position. The adjusting mechanism moves the deformed part (such as the central part or other part) of the front frame slightly forward or backward according to the feedback signal to change the positions of a plurality of sensors, such that the optical signals of the sensors will not be blocked or cannot be received, and the problem of poor touch can be resolved.

Figure 1:
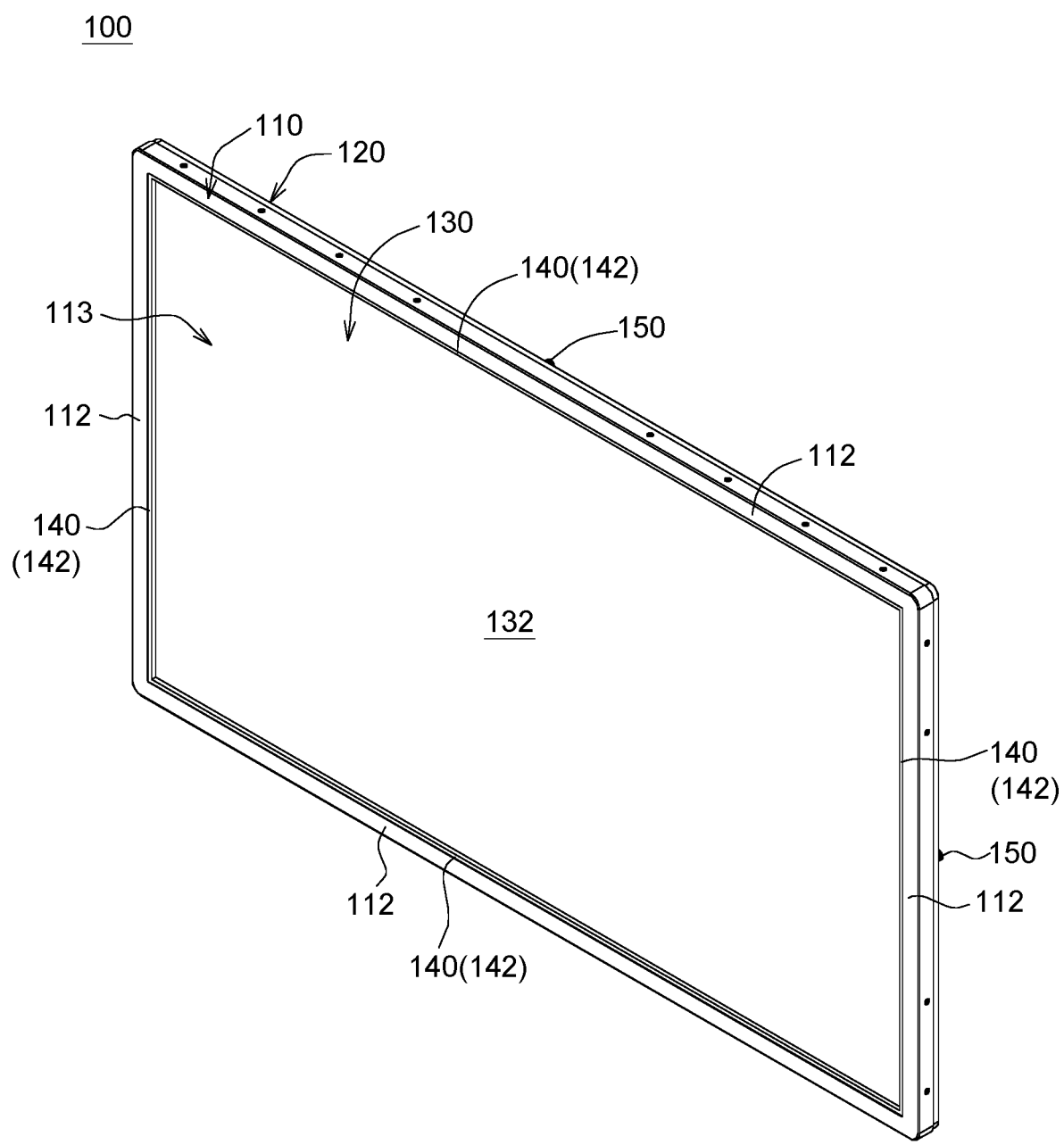
FIG. 1 is a front view of a display device according to an embodiment of the present invention.
Figure 2:
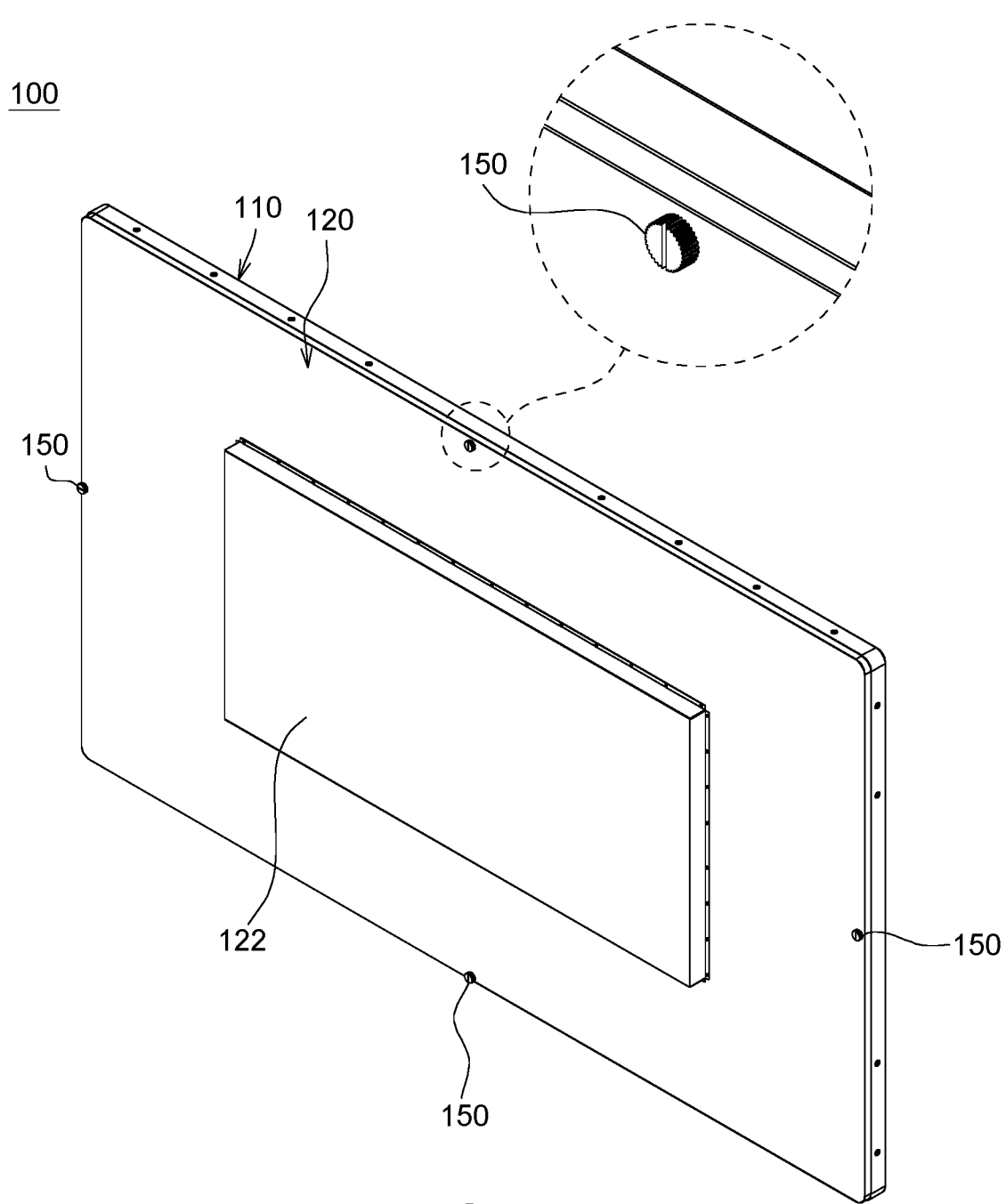
FIG. 2 is a rear view of a display device according to an embodiment of the present invention.

FIG. 1 is a front view of a display device 100 according to an embodiment of the present invention. FIG. 2 is a rear view of a display device 100 according to an embodiment of the present invention. Refer to FIG. 1 and FIG. 2. The display device 100 includes a front frame 110, a rear cover 120, a display panel 130, a plurality of sensors 140 and at least one adjusting mechanism 150.

The display panel 130, which can be a liquid crystal display panel or an OLED display panel, is interposed between the front frame 110 and the rear cover 120, and can be disposed on the front frame 110 through a plurality of positioning members (such as screws or positioning brackets). In an embodiment, the rear cover 120 has an output/input interface such as power input end, signal input end and signal output end. The output/input interface can be covered and protected by a small rear cover 122. The display panel 130 connects an external power source and a signal source through the output/input interface. Besides, the front frame 110 and the rear cover 120 can be engaged by a screw, a latch or a fastener, such that the front frame 110 can be fixed on the rear cover 120 and cover the edges of the display panel 130 to define the area and size of a displayable region on the display panel 130.

As indicated in FIG. 1, the front frame 110 and the rear cover 120 are fixed to form an accommodation space C, in which the display panel 130 is disposed. The front frame 110 has an opening 113, to which a display surface 132 of the display panel 130 is exposed. The opening 113 can be a rectangle with an aspect ratio of 4:3, 16:9 or other values.

Moreover, a plurality of sensors 140 are disposed on the front frame 110 and configured to receive and emit an optical signal above the display surface 132. That is, the sensors 140 are disposed on the inner side of the front frame 110 and are opposite to each other. The sensors 140 can be formed of a plurality of infrared receivers and a plurality of infrared emitters, and can be selectively distributed over four frame portions 112 of the front frame 110 at an equal or a non-equal distance to form an infrared touch frame module 142 (as indicated in FIG. 1). The infrared touch frame module 142 can be assembled on the front frame 110, such that the optical signal emitted and received by the sensors 140 can form an infrared optical network above the display surface 132. When an object (such as a finger, a hand wearing a glove or any touch object) enters the infrared optical network and blocks the infrared signal emitted towards somewhere, the intensity of the infrared receiving signal on the spot will change. By detecting the changes in the intensities of any two infrared receiving signals, the infrared touch frame module 142 can obtain the coordinates of the position of the object for the display device 100 to display the touch.

In an embodiment, when the display device 100 is during the assembly or handling process, the front frame 110 is slightly deformed due to careless handling, if the sensors 140 on the front frame 110 cannot maintain at the same emitting and receiving plane, the infrared signal may not be received, the intensity of the infrared signal may change or the infrared signal may touch other structure and cause a false action. Therefore, the present embodiment provides an adjusting mechanism 150 configured to adjust a deformation amount of the front frame 110 to maintain the sensors 140 at a predetermined emitting position and a receiving position. That is, the sensors 140 of the infrared touch frame module 142 are maintained on the same emitting and receiving plane.

Figure 3:
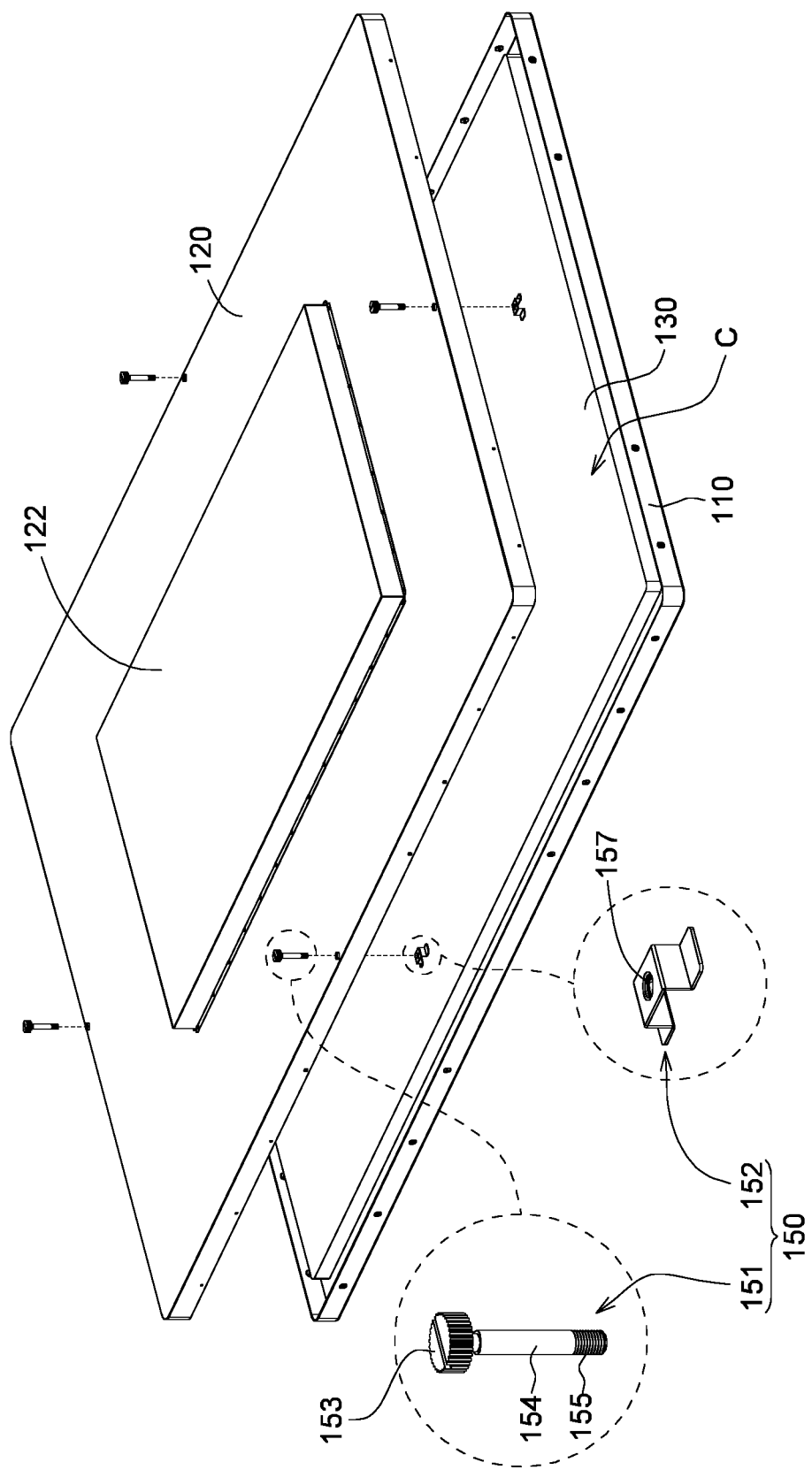
FIG. 3 is an explosion diagram of a display device according to an embodiment of the present invention.
Figure 4:
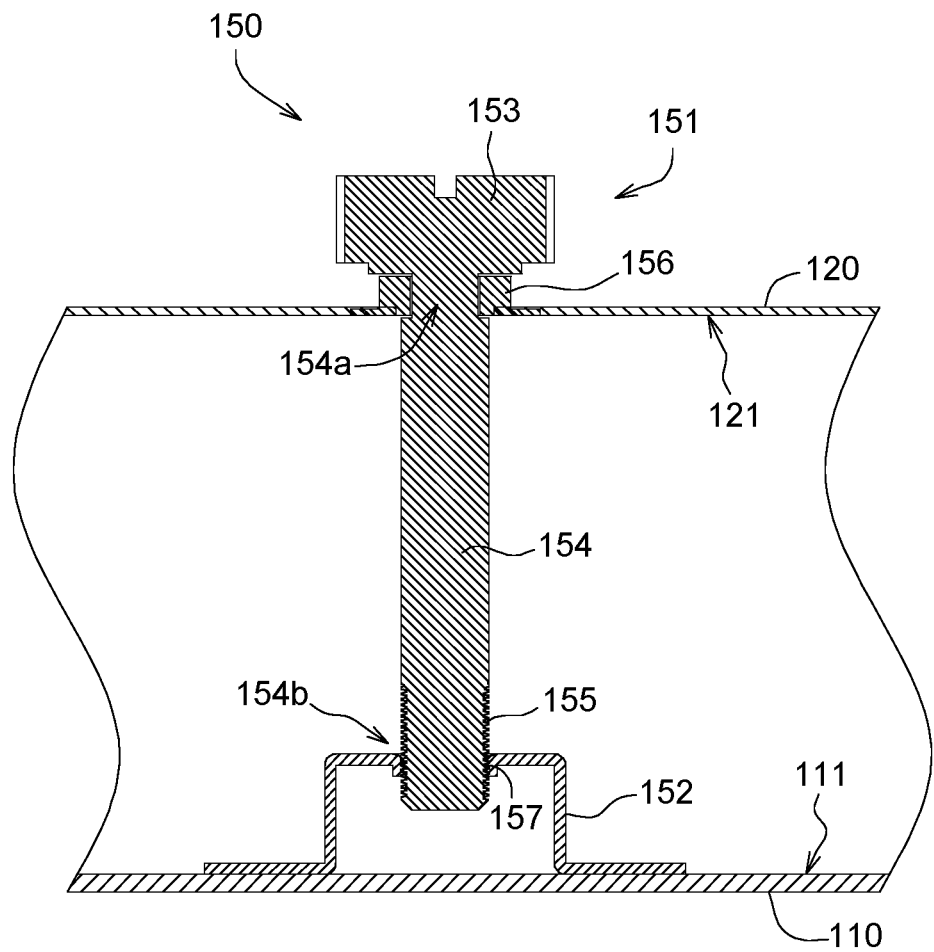
FIG. 4 is a cross-sectional view of an adjusting mechanism according to an embodiment of the present invention.

Refer to FIG. 3 and FIG. 4. FIG. 3 is an explosion diagram of a display device 100 according to an embodiment of the present invention. FIG. 4 is a cross-sectional view of an adjusting mechanism 150 according to an embodiment of the present invention. The adjusting mechanism 150 is disposed on the rear cover 120, and the quantity of adjusting mechanisms 150 can be 2, 4, 6, or other number.

Let four adjusting mechanisms 150 be taken for example. The front frame 110 includes four frame portions 112, and each adjusting mechanism 150 can selectively adjust one of the frame portions 112 and is disposed adjacent to the central position of the frame portion 112 to adjust the deformation amount of the corresponding frame portion 112. Or, in other embodiment, since the long-side frame portion 112 is longer and the deformation amount is relatively larger, 2 or 3 adjusting mechanisms 150 can be selectively disposed on the long-side frame portion 112; since the short-side frame portion 112 is shorter and the deformation amount is relatively smaller, only one adjusting mechanism 150 is disposed on the short-side frame portion 112.

As indicated in FIG. 3, the adjusting mechanism 150 includes a rotation member 151 having one end fixed on the rear cover 120 and the other end passing through the rear cover 120. The rotation member 151 is configured to drive the front frame 110 to move with respect to the rear cover 120. As indicated in FIG. 4, the rotation member 151 has a rotation head 153 and a rotation rod 154. The rotation rod 154 has a first end 154a fixed at the rotation head 153 and a second end 154b passing through the rear cover 120. The rotation head 153 is exposed from the display device 100. When the rotation member 151 rotates, the rotation member 151 drives the front frame 110 to move forward or backward with respect to the rear cover 120 to change the deformation amount of the front frame 110. That is, the front frame 110 has a first inner surface 111, the rear cover 120 has a second inner surface 121, and the deformation amount of the front frame 110 is the distance change between the first inner surface 111 and the second inner surface 121.

In the present embodiment, since the axial direction of the rotation member 151 is perpendicular to the display surface 132 of the display panel 130, when the rotation member 151 rotates to drive the front frame 110 to move forward or backward with respect to the rear cover 120, the position of the sensors 140 above the display surface 132 varies with the movement of the front frame 110, such that the optical signal of the sensors 140 will not be blocked or can be received.

As indicated in FIG. 4, the first end 154a of the rotation rod 154 has a smooth surface, which maintains the fixed relative position between the rotation rod 154 and the rear cover 120 when the rotation rod 154 rotates. That is, the first end 154a (where the outer diameter of the rotation rod 154 is smaller) of the rotation rod 154 can be fixed on the rear cover 120 by a riveted member 156. Furthermore, the first end 154a passes through the riveted member 156, such that the first end 154a will not move with respect to the rear cover 120 when the rotation rod 154 rotates.

Additionally, the second end 154b of the rotation rod 154 has a thread 155, the thread 155 is inserted into a corresponding screw hole 157 on the fixing member 152 (or a screw hole disposed on the first inner surface 111 of the front frame 110) and then rotates. When the rotation member 151 rotates clockwise, the front frame 110 and the fixing member 152 move towards the rear cover 120. Conversely, when the rotation member 151 moves anti-clockwise, the front frame 110 and the fixing member 152 move away from the rear cover 120.

In an embodiment, the fixing member 152 can be soldered and fixed on the first inner surface 111 of the front frame 110, and the screw hole 157 can be disposed at the center of the fixing member 152, such that the rotation member 151 can pass through the screw hole 157 to connect the fixing member 152. The two sides of the fixing member 152 are bent outward from the center of the fixing member 152 to form an L-shape and fixed on the first inner surface 111 of the front frame 110, such that the center of the fixing member 152 is protruded from the first inner surface 111 of the front frame 110. Therefore, the pulling force or thrust generated by the rotation member 151 can be evenly applied on the front frame 110 through the fixing member 152 to maintain the flatness of the front frame 110 and assure that the flatness of the front frame 110 of the display device 100 after adjustment can meet the requirement.

In non-illustrated embodiments, the second end 154b of the rotation rod 154 can directly contact the first inner surface 111 of the front frame 110. Meanwhile, the first end 154a of the rotation rod 154 has a thread which is inserted into a corresponding screw hole and then rotates, such that when the rotation rod 154 rotates, the rotation rod 154 can move with respect to the rear cover 120 and cause the deformation amount of the front frame 110 to change. Therefore, the present invention is not limited to the embodiments illustrated in the accompanying drawings.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
   a front frame having an opening;
   a rear cover, wherein the front frame and the rear cover are fixed to form an accommodation space;
   a display panel disposed in the accommodating space, wherein the display panel has a display surface exposed to the opening;
   a plurality of sensors disposed on the front frame and configured to receive and emit an optical signal above the display surface; and
   at least one adjusting mechanism disposed on the rear cover, the at least one adjusting mechanism having a rotation head outside the rear cover and a rotation rod passing through the rear cover, wherein the rotation rod has a smooth surface to maintain a fixed relative position between the rotation rod and the rear cover and to drive the front frame to move forward or backward with respect to the rear cover and configured to adjust a deformation amount of the front frame to maintain the sensors at a predetermined emitting position and a receiving position.

2. The display device according to claim 1, wherein the front frame has a first inner surface, the rear cover has a second inner surface, and the deformation amount is a distance change between the first inner surface and the second inner surface.

3. The display device according to claim 2, wherein the rotation rod has a thread inserted into a corresponding screw hole on the first inner surface and then rotates.

4. The display device according to claim 3, wherein the screw hole is disposed on a fixing member, and the fixing member is fixed on the first inner surface.

5. The display device according to claim 1, wherein the front frame comprises four frame portions, and the at least one adjusting mechanism can selectively adjust one of the frame portions and is disposed adjacent to a central position of the one of the frame portions.

6. The display device according to claim 1, wherein the adjusting mechanism further comprises a fixing member, the fixing member is disposed on the first inner surface of the front frame and has a screw hole through which the rotation rod passes to connect the fixing member.

7. The display device according to claim 6, wherein the rotation rod has an axial direction perpendicular to the display surface, the screw hole is located at a center of the fixing member, and two sides of the fixing member bent outward from the center of the fixing member to form an L-shape and fixed on the first inner surface of the front frame.

8. An adjusting mechanism adapted to a display panel interposed between a front frame and a rear cover, wherein the display panel has a display surface exposed to an opening of the front frame, a plurality of sensors are disposed on the front frame and located above the display surface, and the adjusting mechanism is configured to adjust a deformation amount of the front frame to maintain the sensors at a predetermined emitting position and a receiving position, the adjusting mechanism has a rotation head outside the rear cover and a rotation rod passing through the rear cover, wherein the rotation rod has a smooth surface to maintain a fixed relative position between the rotation rod and the rear cover and drives the front frame to move forward or backward with respect to the rear cover when the rotation rod rotates.

9. The adjusting mechanism according to claim 8, wherein the front frame has a first inner surface, the rear cover has a second inner surface, and the deformation amount is a distance change between the first inner surface and the second inner surface.

10. The adjusting mechanism according to claim 9, wherein the rotation rod has a first end fixed at the rotation head and a second end passing through the rear cover, and the rotation head is exposed from the display device to change the deformation amount when the rotation rod rotates.

11. The adjusting mechanism according to claim 10, wherein the second end of the rotation rod has a thread inserted into a corresponding screw hole on the first inner surface and then rotates.

12. The adjusting mechanism according to claim 11, wherein the screw hole is disposed on a fixing member, and the fixing member is fixed on the first inner surface.

13. The adjusting mechanism according to claim 8, wherein the front frame comprises four frame portions, and the at least one adjusting mechanism can selectively adjust one of the frame portions and is adjacent to a central position of the one of the frame portions.

14. The adjusting mechanism according to claim 8, wherein the adjusting mechanism further comprises a fixing member, the fixing member is disposed on the first inner surface of the front frame and has a screw hole through which the rotation rod passes to connect the fixing member.

15. The adjusting mechanism according to claim 14, wherein the rotation rod has an axial direction perpendicular to the display surface, the screw hole is located at a center of the fixing member, and the two sides of the fixing member bent outward from the center of the fixing member to form an L-shape and fixed on the first inner surface of the front frame.

* * * * *